United States Patent [19]

Fogg

[11] 3,757,240

[45] Sept. 4, 1973

[54] ACTIVE ATTENUATOR

[75] Inventor: O. Douglas Fogg, Colorado Springs, Colo.

[73] Assignee: Hewlett-Packard Company, Palo Alto, Calif.

[22] Filed: Mar. 15, 1972

[21] Appl. No.: 234,832

[52] U.S. Cl. .................... 330/29, 307/237, 307/264, 328/168, 330/30 D

[51] Int. Cl. ............................ H03g 3/00, H03f 1/30

[58] Field of Search .................... 307/215, 218, 235, 307/237, 264; 328/146, 147, 168, 169, 69, 172; 330/29, 30 D, 145

[56] References Cited

UNITED STATES PATENTS

| | | | |
|---|---|---|---|
| 3,651,344 | 3/1972 | O'Shea | 307/270 |
| 3,641,450 | 2/1972 | Lunn | 330/29 X |
| 3,472,957 | 10/1969 | Kaye et al. | 330/29 X |
| 3,483,425 | 12/1969 | Yanishevsky | 307/235 X |
| 3,446,989 | 5/1969 | Allen et al. | 307/244 X |
| 3,512,096 | 5/1970 | Nagata et al | 330/29 |
| 3,522,443 | 8/1970 | Kanter | 307/237 X |
| 3,539,831 | 11/1970 | Gilbert | 307/235 |
| 3,559,084 | 1/1971 | Wise | 330/29 X |
| 3,566,281 | 2/1971 | Baumann | 328/171 |
| 3,582,807 | 6/1971 | Addis | 330/29 X |

FOREIGN PATENTS OR APPLICATIONS

| | | | |
|---|---|---|---|
| 1,094,296 | 12/1960 | Germany | 307/207 |

*Primary Examiner*—John S. Heyman

*Assistant Examiner*—L. N. Angnos

*Attorney*—A. C. Smith

[57] ABSTRACT

A variable attenuator includes active elements for providing the desired attenuation with good pulse response. Each of the transistors in the circuit is included in a current-splitting network which assures that the power dissipation remains the same, regardless of the attenuation setting.

2 Claims, 1 Drawing Figure

PATENTED SEP 4 1973
3,757,240
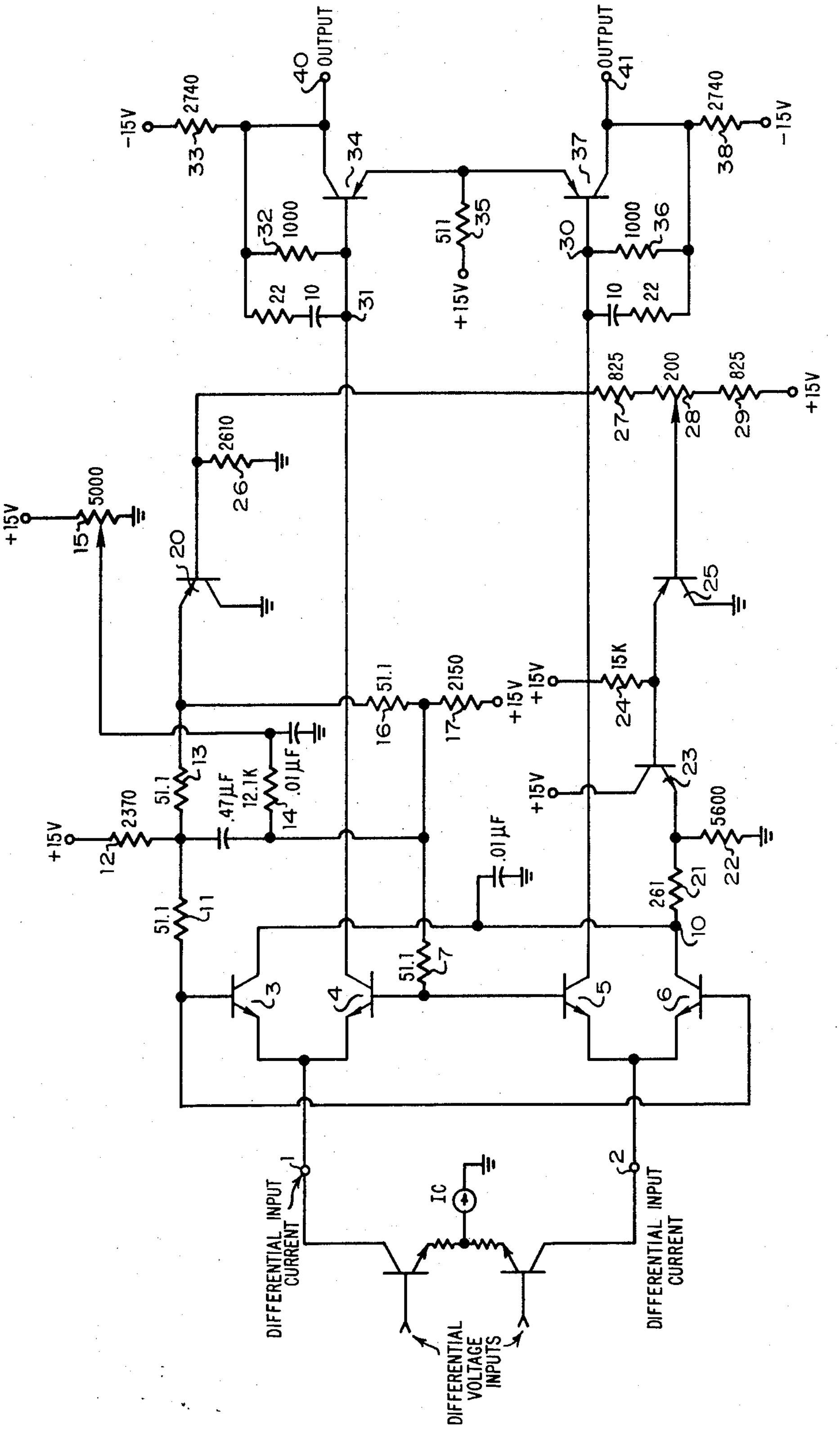

ACTIVE ATTENUATOR

BACKGROUND AND SUMMARY OF THE INVENTION

Certain known electronic attenuator circuits have pulse responses that are inadequate for use, for example, in displays where minute perturbations in the pulse response are noticeable in the displayed signal.

Much of the poor pulse response in a conventional active attenuator circuit is caused by differences in the power dissipated by transistors in the circuit and, hence, by the differences in thermally-sensitive circuit parameters. For example, a change in signal current which causes differing changes in power dissipation in two transistors produces a greater change in temperature of one transistor than in the other transistor. This difference in temperature causes a difference in the base to emitter voltages of the two transistors which, in turn, causes the transfer ratio of the attenuator to change with some thermal time constant. As a result, the pulse response of the circuit may become rounded with a several microsecond time constant.

The circuit of the present invention greatly improves the pulse response of electronic attenuator circuits by matching the power dissipation of the transistors in a current-splitting network to assure that each transistor dissipates the same amount of power. Each transistor thus responds with identical temperature changes as the signal current changes, thereby preserving the attenuation ratio substantially constant for all changes of signal current. The present invention maintains essentially identical power in the transistors as the circuit attenuation is varied. The pulse response of the circuit is thus maintained highly accurate for all attenuation settings.

DESCRIPTION OF THE DRAWINGS

The drawing is a schematic circuit diagram of the improved active attenuator according to the preferred embodiment of the present invention.

DESCRIPTION OF THE PREFERRED EMBODIMENT

In most active attenuators of conventional design, a change in the attenuation results in a change in the pulse response. This is caused primarily by a change in the relative power dissipated in pairs of transistors as the active elements. For example, for a given attenuation, a pair of transistors may be arranged to dissipate equal amounts of power. If the attenuation is changed, the power dissipations in the transistors may become unequal. This establishes unequal operating temperatures with concomitant changes in the pulse response of the circuit.

Referring now to the drawing, thre is shown the preferred embodiment of this invention. Two transistor pairs 3, 4 and 5, 6 form the basic attenuation circuit. A differential input current is applied to input terminals 1 and 2. Terminal 1 is connected to the emitters of transistors 3 and 4, and terminal 2 is connected to the emitters of transistors 5 and 6. The collectors of transistors 3 and 6 are connected together at node 10.

The bases of transistors 3 and 6 are connected together, as are the bases of transistors 4 and 5. The output of the pair of transistors 3, 4 is taken from the collector of transistor 4 and is connected to the base of transistor 34 at node 31. The output of the pairs of transistors 5, 6 is taken from the collector of transistor 5 and is connected to the base of transistor 37 at node 30. Transistors 34 and 37 form a differential voltage amplifier, the output of which is taken between terminals 40 and 41.

The base of transistor 3 is connected to a bias supply through resistors 11 and 12 and to the emitter of transistor 20 through resistors 11 and 13. The base of transistor 4 is connected to a bias supply through resistors 7 and 17 and to the emitter of transistor 20 through resistors 7 and 16. The junction of resistors 7, 16 and 17 is connected to variable resistor 15 through resistor 14. The variable resistor 15 is connected between a voltage supply and ground. The adjustment of resistor 15 sets the attenuation of the circuit.

The collector of transistor 6 is connected to the emitter of transistor 23 through resistor 21. The emitter of transistor 23 is connected to ground through resistor 22 and its collector is connected to the bias supply. The base of transistor 23 is connected to the emitter of transistor 25. This junction is connected to a bias supply through resistor 24. The collector of transistor 25 is connected to ground.

Resistors 26, 27, 28 and 29 form a voltage divider which, in conjunction with transistor 20, sets a bias voltage for the bases of the current-splitting transistors and which, in conjunction with transistors 23 and 25, sets the bias voltage applied to resistor 21. The base of transistor 25 is connected to the center-tap of variable resistor 28. Resistor 28 is connected to a supply voltage through resistor 29 and to the base of transistor 20 through resistor 27. The base of transistor 20 is connected to ground through resistor 26. The emitters of the differential amplifier 34, 37 are connected to a bias supply through resistor 35. Resistors 32, 33 and 35 provide the bias network of transistor 34, and resistors 36, 38 and 35 provide the bias network for transistor 37.

Differential input currents applied to terminals 1 and 2 are attenuated by transistors 3 through 6 and the attenuation factor is determined by the adjustment of variable resistor 15. The output current from the attenuation stage is applied to the bases of transistors 34 and 37. Because transistors 34 and 37 are connected as a differential amplifier, the signal voltages at nodes 30 and 31 are approximately equal. Thus transistors 34 and 37, together with their associated circuitry, can be considered to have a Thevenin equivalent circuit of a single resistor connected at one end to the nodes 30 and 31 and at the other end to a Thevenin equivalent voltage source.

The circuitry connected to node 10, comprising the transistors 20, 23 and 25, the variable resistor 28, and the associated biasing resistors and voltages, act as a biasing network for the attenuator transistors 3 and 6. This network maintains a constant pulse response for the attenuator by keeping the power dissipation of the attenuator transistors 3 and 4 as well as 5 and 6 equal for any attenuator setting. This bias circuitry can also be considered to have a Thevenin equivalent circuit that includes a single resistor connected at one end to node 10 and at the other end to a Thevenin equivalent voltage source. The variable resistor 28 is adjusted so that the biasing network has a Thevenin equivalent circuit that is equal to the Thevenin equivalent circuit of the differential output amplifier for every attenuation setting, i.e., for every setting of resistor 15. In the analysis, this means that the Thevenin equivalent resistors connected to nodes 30, 31 and to node 10 are equal and the Thevenin equivalent voltage sources connected to such equivalent resistors are also equal. Because of this, the pairs of transistors 3 and 4, 5 and 6 dissipate approximately the same power for any attenuation setting and thereby provide a constant pulse response for all attenuation settings.

I claim:

1. Signal translating circuit comprising:

first, second, third and fourth transistors, each having emitter, base and collector electrodes;

means connecting the emitter electrodes of the first and second transistors to receive a first input signal;

means connecting the emitter electrodes of the third and fourth transistors to receive a second input signal;

first supply means connected to supply bias signal to the collector electrodes of the first and fourth transistors;

second supply means connected to supply bias signal to the base electrodes of the first and fourth transistors;

third supply means connected to supply bias signal of selectable magnitude to the base electrodes of the second and third transistors; and output means connected to the collector electrodes of the second and third transistors for supplying bias signals thereto to establish on said collector electrodes collector voltages which are substantially equal independently of the magnitudes of currents in said collector electrodes as said currents vary, said output means producing from said collector currents first and second output signals representative of the first and second input signals altered in amplitude by an amount determined by the magnitude of bias signal applied to the base electrodes of the second and third transistors by said third supply means.

2. Signal translating circuit as in claim 1 wherein:

said output means includes a pair of transistors having collector and base electrodes and having emitter electrodes connected in common as a differential amplifier having an input circuit including said base electrodes connected to the collector electrodes of said second and third transistors and providing said first and second output signals at the collector electrodes thereof; and each of said pair of transistors includes feedback resistors connected between the respective collector and base electrodes.

* * * * *